(12) United States Patent
Ossman et al.

(10) Patent No.: US 10,775,433 B1
(45) Date of Patent: Sep. 15, 2020

(54) PROGRAMMABLE/CONFIGURABLE LOGIC CIRCUITRY, CONTROL CIRCUITRY AND METHOD OF DYNAMIC CONTEXT SWITCHING

(71) Applicant: Flex Logix Technologies, Inc., Mountain View, CA (US)

(72) Inventors: Valentin Ossman, Livermore, CA (US); Anthony Kozaczuk, Burlingame, CA (US); Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 16/369,809

(22) Filed: Mar. 29, 2019

Related U.S. Application Data

(60) Provisional application No. 62/655,685, filed on Apr. 10, 2018.

(51) Int. Cl.
| | | |
|---|---|---|
| *G11C 11/419* | (2006.01) | |
| *G01R 31/3177* | (2006.01) | |
| *G06F 30/331* | (2020.01) | |
| *H03K 19/17728* | (2020.01) | |

(52) U.S. Cl.
CPC ....... *G01R 31/3177* (2013.01); *G06F 30/331* (2020.01); *G11C 11/419* (2013.01); *H03K 19/17728* (2013.01)

(58) Field of Classification Search
CPC ................ G11C 16/3459; G06F 30/331
See application file for complete search history.

(56) References Cited

U.S. PATENT DOCUMENTS

| | | | |
|---|---|---|---|
| 4,809,228 A * | 2/1989 | Iida ...................... | G06F 11/183 365/189.08 |
| 6,278,290 B1 | 8/2001 | Young | |
| 6,363,019 B1 | 3/2002 | Erickson et al. | |
| 6,671,202 B1 | 12/2003 | Bauer | |
| 7,250,786 B1 * | 7/2007 | Trimberger .......... | H03K 19/007 326/11 |
| 9,543,958 B1 * | 1/2017 | Wang ............... | H03K 19/17772 |
| 9,786,361 B1 * | 10/2017 | Wang .................. | G11C 11/419 |
| 10,523,209 B1 * | 12/2019 | Wang ............... | H03K 19/17728 |
| 2013/0093461 A1 * | 4/2013 | Voogel ............. | H03K 19/17744 326/38 |

(Continued)

*Primary Examiner* — Mushfique Siddique
(74) *Attorney, Agent, or Firm* — Neil A. Steinberg

(57) ABSTRACT

An integrated circuit comprising a field programmable gate array (FPGA) including a plurality of logic tiles wherein each logic tile includes circuitry including (i) logic circuitry and (ii) an interconnect network including a plurality of multiplexers. The FPGA further includes a robust memory cell including: three or more storage elements that are more than one time programmable to store a data state, majority detection circuitry to detect a majority data state stored in the three or more storage elements; and an output, coupled to the majority detection circuitry, to output mode select data which is representative of the majority data state stored in the storage elements. The FPGA also includes mode/function select circuitry to configure a mode of operation of at least a portion of the circuitry in one or more of the plurality of logic tiles based on the mode select data.

17 Claims, 12 Drawing Sheets

(56) References Cited

U.S. PATENT DOCUMENTS

2014/0143586 A1* 5/2014 Dalumi ............... G06F 13/4234
                                                            713/600
2017/0063378 A1* 3/2017 Tate ................. H03K 19/17728
2017/0294900 A1* 10/2017 Fradet .................. H03K 3/0375

* cited by examiner

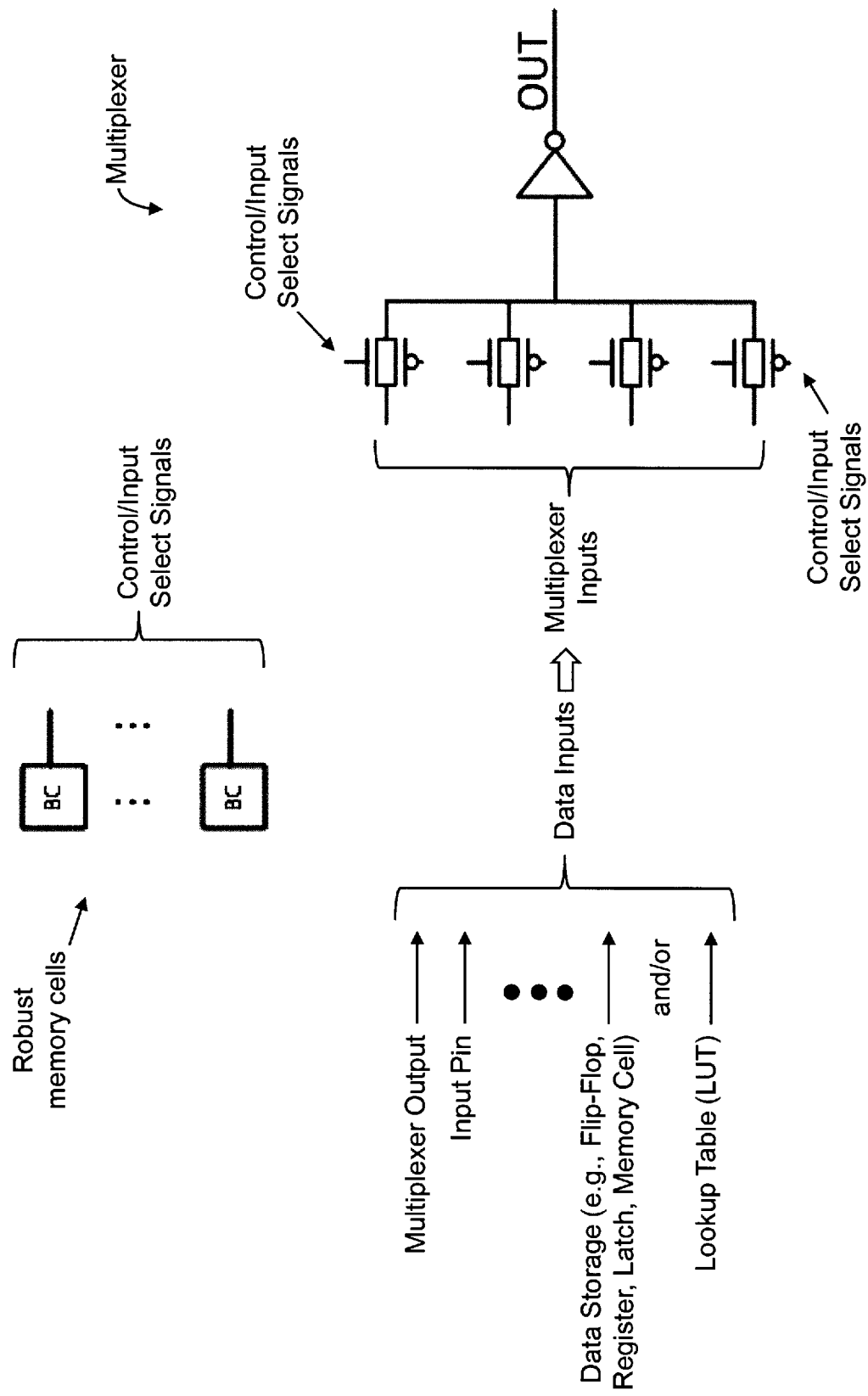

PROGRAMMABLE/CONFIGURABLE LOGIC CIRCUITRY, CONTROL CIRCUITRY AND METHOD OF DYNAMIC CONTEXT SWITCHING

RELATED APPLICATION

This non-provisional application claims priority to and the benefit of U.S. Provisional Application No. 62/655,685, entitled "Dynamic Context Switching Circuitry and Methods of Programming Same", filed Apr. 10, 2018; the '685 provisional application is hereby incorporated herein by reference in its entirety.

INTRODUCTION

In one aspect, the present inventions are directed to circuitry to implement dynamic context switching control and methods of programming such circuitry, for example, in situ and/or at or during power-up, start-up, initialization, re-initialization, configuration, re-configuration or the like. The circuitry of the present inventions employs robust memory cells (e.g., radiation-hardened or single event upsets (SEU) memory cells), programmed to a condition or state according to the present inventions, to store, set, configure or define a mode of operation or function of a processor, controller, state machine, gate array, programmable gate array (PGA), field programmable gate array (FPGA), and system-on-chip (SOC) (hereinafter collectively "integrated circuit").

In one embodiment, the robust memory cells include a plurality of storage elements (e.g., three or more—such as, for example, SRAM cells, registers and/or latches) and majority detection circuitry. In operation, the present inventions, in one aspect, program a majority of storage elements (concurrently or consecutively) of the robust memory cell(s) to a first data state. In this exemplary embodiment, the robust memory outputs the first data state which, alone or in conjunction with the data state(s) output/stored in other robust memory cell(s), is employed or defines, determines or configures a mode of operation or function of the integrated circuit (or a portion thereof —for example, a mode of operation of a portion of the circuitry of an integrated circuit). Here, for example, the majority detection circuitry in/of the robust memory cell, based on the data states stored in the associated storage elements, outputs data which is representative of the data state of a majority of those storage elements (e.g., the first data state) to mode/function selection circuitry which, based thereon, defines, configures or implements a mode of operation or function of the integrated circuit (e.g., a mode of operation or function of a portion of the circuitry of an integrated circuit (e.g., an FPGA)).

In another embodiment, the present inventions program a majority of storage elements (concurrently or consecutively) of the robust memory cell(s) to a first data state and a minority of the storage elements (at least one) to a second data state (which is different from the first data state). In operation, the robust memory outputs the first data state which, alone or in conjunction with the data state(s) output/stored in other robust memory cell(s), is employed or defines, determines or configures a mode of operation or function of the integrated circuit. Again, majority detection circuitry, which is electrically connected to the plurality of associated storage elements, outputs data which is representative of the data state stored in a majority of the associated storage elements (e.g., the first data state) to mode/function selection circuitry which, using or based on that output, defines, configures or implements a mode of operation or function of the integrated circuit (e.g., a portion of the circuitry thereof/therein).

The robust memory cell may be programmed or configured according to the present inventions using any technique now known or later developed—whereby (i) a majority of the storage elements of the cell store a first/majority data state and/or (ii) a majority (not all) of the storage elements of the cell store a first/majority data state and a minority (at least one) of the storage elements store a second/minority data state. In a preferred embodiment, the robust memory cell is programmed or configured such that the difference between the number of storage elements storing the first/majority data state and the number of storage elements storing the second/minority data state is equal to one. In that way, the robust memory may be more rapidly programmed (or toggled) between outputting the different data states which, alone or in conjunction with the data state(s) output/stored in other robust memory cell(s), is employed or defines, determines or configures a mode of operation or function of the integrated circuit.

Moreover, in yet another preferred embodiment, the robust memory cell may be programmed or configured to output different data states (e.g. change between majority and minority states) by changing the value in the storage element storing a majority data state to the data state of the value of the minority state, which—in turn—is then the "new" majority data state. Such "new" majority data state may be output or obtained from the one or more storage elements (of the plurality of storage elements) that is/are most rapidly or readily programmable or available to be programmed in the configuring or programming process of the robust memory cell. Notably, the data state stored in a majority of the storage elements and/or the data state stored in a minority of the storage elements may be established, programmed or configured using any technique now known or later developed.

The storage elements may be programmed using programming circuitry which generates, applies and/or provides data and control signals to such elements to write the appropriate data states therein. In response thereto, the storage elements stores the data state. Notably, in one embodiment, all of the plurality of storage elements are more than one time programmable, for example, in situ (i.e., during operation of the integrated circuit) and/or at or during power-up, start-up, initialization, re-initialization, configuration, re-configuration or the like. In another embodiment, a plurality (but not all) of the storage elements is more than one time programmable. In yet another embodiment, only one of the storage elements of the plurality of storage elements is more than one time programmable.

In one embodiment, the robust memory cells of the present inventions are implemented in an FPGA to store, set, configure or define one or more modes of operation or functions of the FPGA (or a portion thereof, for example, one or more logic tiles of an FPGA or selected circuitry of one or more logic tiles of an FPGA). Briefly, an FPGA is an integrated circuit which is configured and/or reconfigured (hereinafter, unless stated otherwise, collectively "configured" or the like (e.g., "configure" and "configurable")) by a user, operator, customer and/or designer before and/or after manufacture. The FPGA may include, among other things, programmable logic components (often called "logic cells", "configurable logic blocks" (CLBs), "logic array blocks" (LABs), or "logic tiles"—hereinafter collectively "logic tiles")) and an interconnect network comprising configurable interconnects that facilitate communication between logic components. Thus, in one embodiment of the present inventions, one or more logic tiles include robust memory cells to store, set, configure, determine or define a mode of operation or function of one or more (or all) logic tiles of an FPGA.

Notably, the network of configurable interconnects of the FPGA may be configured to facilitate communication within and between the logic tiles (e.g., between logic circuitry in one or more of the logic tiles). (See, for example, FIGS. 1A and 1B). Each logic tile typically includes thousands of transistors which may be configured to perform combinational and/or sequential functions (simple and/or complex). Such transistors are interconnected to form a plurality of multiplexers having two or more inputs. The selection inputs of the multiplexers may be electrically connected to memory such as, for example, robust memory cells which, when programmed, determine which input of the multiplexer is connected to the multiplexer output. The memory cells may be static or dynamic. For example, in the context of static cells, the selection inputs may be electrically connected to one or more input pins, flip-flops, latches and/or blocks/arrays of memory (e.g., SRAM) that may be programmed after manufacture of the integrated circuit. Here, in one embodiment of the present inventions, the robust memory cells of the present inventions may store, set, configure, determine or define the interconnect network (or a portion thereof) of one or more (or all) logic tiles of an FPGA.

BRIEF DESCRIPTION OF THE DRAWINGS

The present inventions may be implemented in connection with embodiments illustrated in the attached drawings. These drawings show different aspects of the present inventions and, where appropriate, reference numerals or names illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as ideal, preferred or advantageous, for example, over other embodiments or implementations; rather, it is intended reflect or indicate the embodiment(s) is/are "example" embodiment(s).

FIG. 3A illustrates an exemplary inverting-type multiplexer wherein one or more data inputs are connected to the output; in this embodiment, the robust memory cells store the control/input select signals which determine whether an associated data input is connected to the output; in normal operation (e.g., after power-up, start-up or performance of initialization), the data state or polarity of the signal applied to a control input is determined by the data state stored in or output by the robust memory cells; notably, data inputs applied to the multiplexer inputs may also be dynamic or static; such signals may originate from, for example, a robust memory cell or data storage element (e.g., a typical memory cell, register, flip-flop, latch, block/array of memory), an input pin, a look-up table LUT (of any kind or), and/or an output of another multiplexer; notably, the robust memory cells may be programmed in situ and/or at or during power-up, start-up, initialization, re-initialization, configuration, re-configuration or the like;

Figure 1A:
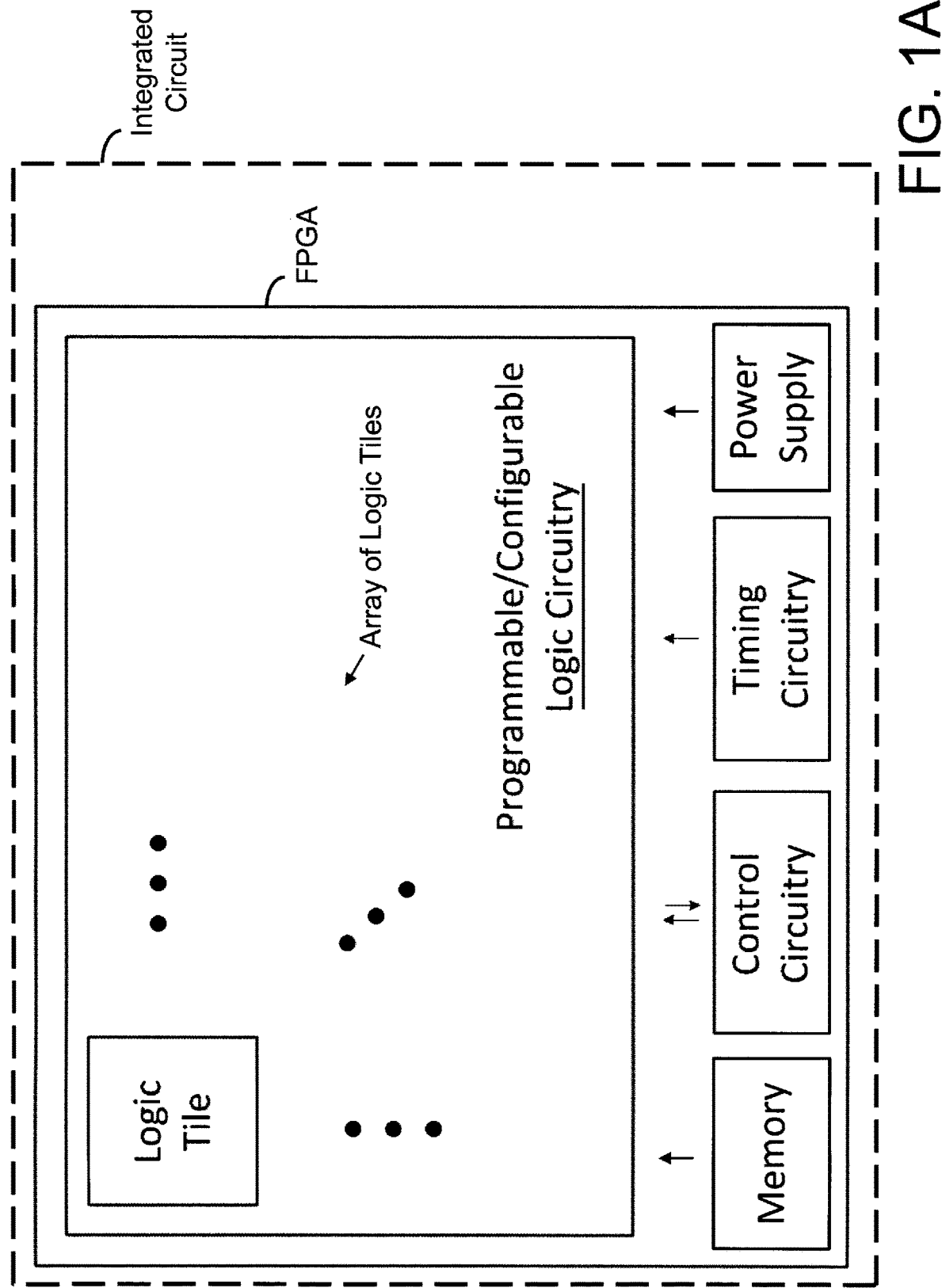
FIG. 1A illustrates a block diagram representation of, for example, an exemplary integrated circuit including control circuitry and programmable/configurable logic circuitry (which may include one or more logic tiles, each of which includes logic transistors and robust memory cells to store, set, configure, determine or define a mode of operation or function), wherein a plurality (or all) of the logic tiles may be interconnected, for example, via an interconnect network and may include one or more robust memory cells that are programmed to a condition or in a manner or state according to the present inventions to set, determine or define (alone or in combination with other data) a mode of operation or function of the FPGA (or a portion thereof, for example, one or more logic tiles of the programmable/configurable logic circuitry of the FPGA)
Figure 1B:
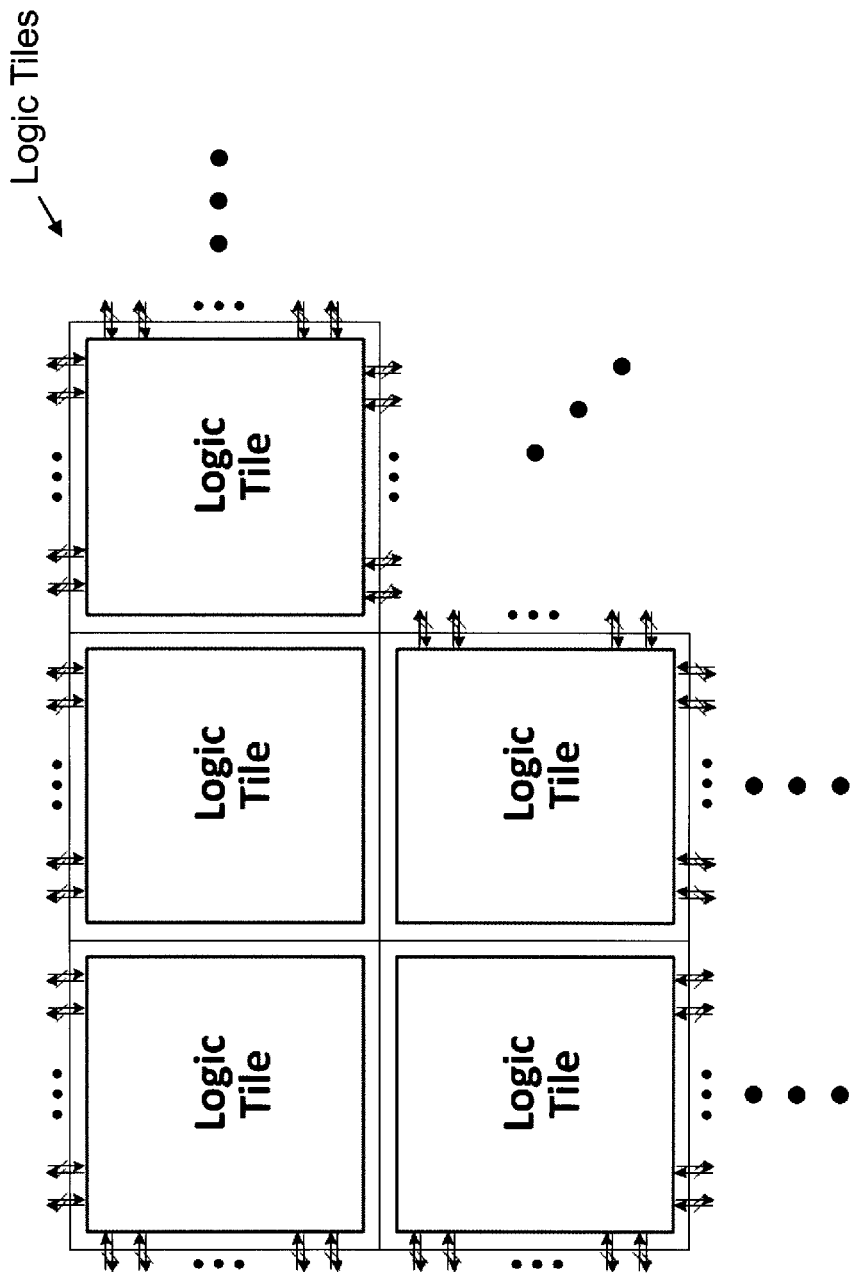
FIG. 1B illustrates a block diagram representation of a plurality of interconnected logic tiles of an exemplary embodiment of programmable/configurable logic circuitry, for example, of an exemplary FPGA, wherein input/output of the logic tiles may facilitate communication between logic tiles and/or circuitry external to the programmable/configurable logic circuitry; notably, the programmable/configurable logic circuitry may be comprised of a plurality of programmable logic tiles wherein each logic tile includes (i) a plurality of multiplexers which are electrically interconnected into a network (e.g., a hierarchical network and/or mesh network) and (ii) one or more robust memory cells that may be programmed according to the present inventions to implement or determine a mode of operation or function of one or more (or all) logic tiles of the programmable/configurable logic circuitry of the FPGA; notably, in one embodiment, the FPGA includes tile-to-tile interconnects that interconnect the logic tile interconnect network of each logic tile thereby providing communication between the logic tiles (See, U.S. Provisional Patent Application No. 62/735,988 (which is incorporated herein by reference)); the logic tile interconnect network of each logic tile may include a plurality of switch matrices (e.g., an M×N switch matrix) arranged in a plurality of switch matrix stages or switch matrices stages which are interconnected into a logic tile interconnect network via logic tile interconnects (see, for example, the interconnect networks described and/or illustrated in U.S. Pat. No. 9,503,092, which are incorporated herein by reference); as such, logic tiles are configurable to communicate, during operation of the integrated circuit, between computing elements within the logic tile as well as with at least one other logic tile of the FPGA.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed or illustrated separately herein.

DETAILED DESCRIPTION

In a first aspect, the present inventions relate to circuitry to control, set or define a mode of operation or function of an integrated circuit. The circuitry includes one or more robust memory cells (e.g., radiation-hardened or single event upsets (SEU) memory cells), which, in one embodiment, is programmed to a condition or in a manner or state according to certain aspects of the present inventions, to store data that is employed to implement dynamic context switching control, for example, in situ and/or at or during power-up, start-up, initialization, re-initialization, configuration, re-configuration or the like. In one embodiment, each robust memory cell includes a plurality of storage elements (e.g., one or more SRAM cells, registers and/or latches) and majority detection circuitry. The present inventions may program or store a majority of the storage elements of each of the robust memory cells to a first data state. In one embodiment, a minority of the storage elements of the robust memory cells may be programmed to or store a second data state. The majority detection circuitry, in operation, determines or detects the data state stored in the majority of the storage elements and, in response thereto, provides or outputs the data which is representative of the data state to, for example, other circuitry in the integrated circuit (e.g., circuitry to implement, define or configure a mode of operation or function in/of the integrated circuit—(e.g., a mode of operation or function in/of a portion of the integrated circuit). Here, the majority data state is output by the robust memory cell and, alone or in combination with other data (e.g., data from other robust memory cell(s)—including robust memory cell(s) (which may be programmed to a state or condition or in a manner according to the present inventions) sets, defines, determines or configures and/or is employed to establish, define or implement a mode of operation or function to be performed in or by circuitry of the integrated circuit (e.g., a mode of operation of a portion of the circuitry of the integrated circuit).

The storage elements of each robust memory cell of the present invention may be programmed to or store a certain data state either concurrently or consecutively. For example, in one embodiment, a predetermined data state may be applied to the data input of each storage element and thereafter stored in a plurality of elements in parallel (e.g., via application of a clock or control signal). In another embodiment, the storage elements may be configured such that the output of a first storage element of a memory cell is connected to the input of a second storage element of that cell and the output of the second storage element is connected to the input of a third storage element of that cell (and so on). In one embodiment, the robust memory cell may be programmed by applying a predetermined data state to a first storage element which may then be clocked to other storage elements of the memory cell thereby consecutively, sequentially or serially storing the data into designated or predetermined storage elements of the robust memory cell.

As noted above, in one embodiment, the robust memory cell is programmed to or placed in a condition such that a majority (not all) of the storage elements of the cell are programmed to or store a first data state and a minority (at least one) of the storage elements are programmed to or store a second data state (i.e., a data state that is different from the first/majority data state). Here, all of the storage elements of the robust memory cell are not programmed to the same data state but at least one storage element is programmed to a data state that is different from the data state stored in a majority of the storage elements of the robust memory cell. This notwithstanding, the majority detection circuitry determines or detects the data state stored or contained in a majority of the storage elements and, in response, outputs data which is representative of the data state stored in the majority of storage elements. In one embodiment, the data output by the majority detection circuitry is representative of a mode/function select signal. Here, mode/function select circuitry, in response to the mode/function select signal(s) from the robust memory cell(s), establishes, defines or implements a predetermined mode of operation or function in relation to other circuitry of the integrated circuit (e.g., the mode/function select signal enables certain circuitry, and/or implements a particular interconnect architecture via changing the control input(s) applied to multiplexers of the interconnect architecture, and/or read/write different data to different memory address locations, and/or operates a digital signal processor (DSP) in a different mathematical operand, etc.). For example, any and all reconfigurable components/circuitry of an FPGA may have one or more (or all) memory cells associated with the reconfigurable components/circuitry replaced with robust memory cells of the present inventions. In this way, the mode/function operations/enablement of the FPGA may be implemented via programming or controlling one or more robust memory cells of the present inventions—thereby implementing a selected/predetermined mode of operation therefor (which may be a portion of the circuitry of the FPGA—e.g., a subset of the logic tiles of the FPGA).

Figure 2:
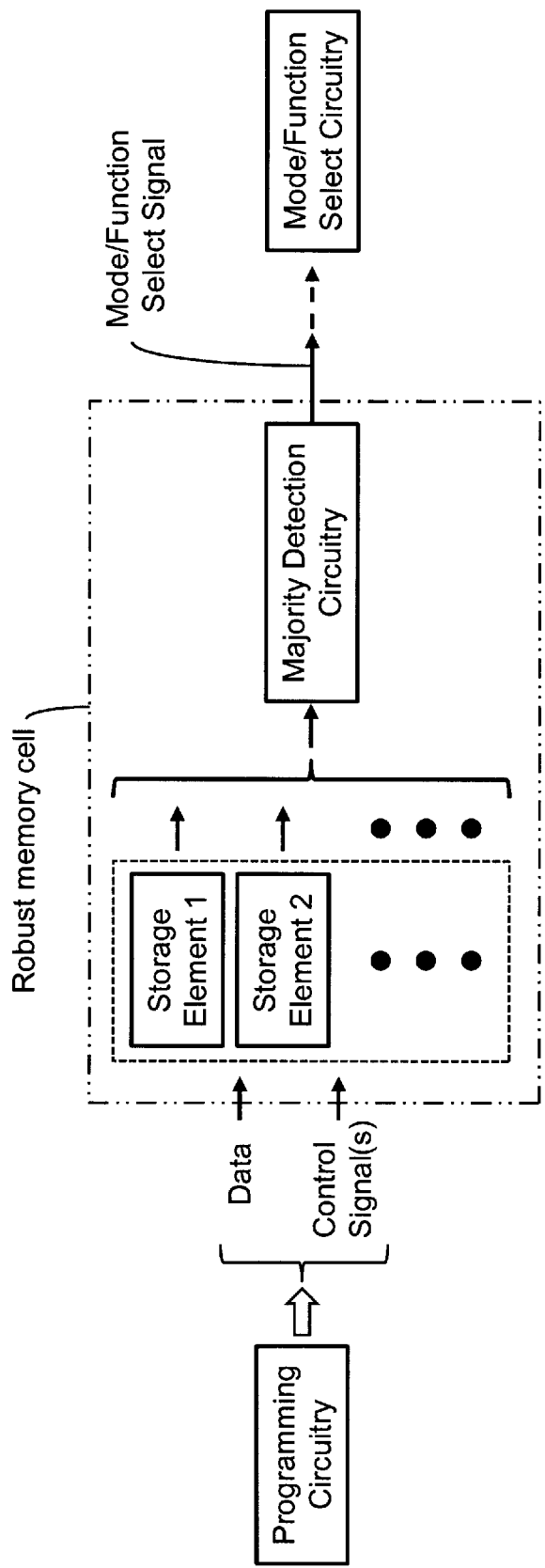
FIG. 2 illustrates an exemplary block diagram of a robust memory cell according to certain aspects of the present inventions, wherein, in this exemplary embodiment, the robust memory cell includes a plurality of storage elements, (which, in operation, are programmed to a condition or in a manner or state according to certain aspects of the present inventions,) connected to majority detection circuitry to determine or detect the majority data state stored in the plurality of storage elements; the output of the majority detection circuitry is (alone or in combination with other inputs/signals—including signals output by or from other robust memory cell(s)) representative of a mode or function select signal to implement or determine a mode of operation or function of one or more (or all) logic tiles (or portions of such logic tile(s)) of the FPGA; programming circuitry which generates, applies and/or provides data and control signals to such storage elements to write the appropriate data states therein; in response to the data and control signals, the storage elements stores the data state; notably, in one embodiment, mode/function select circuitry responsively implements (e.g., in situ and/or at or during power-up, start-up, initialization, re-initialization, configuration, re-configuration or the like) implements one or more modes of operation or functions of an integrated circuit, for example, the FPGA.

With reference to FIG. 2, in one embodiment, the robust memory cell is a radiation-hardened or single event upsets (SEU) memory cell. For example, in one embodiment, the robust memory cell includes (i) a plurality of storage elements (e.g., three or more storage elements)—such as, for example, SRAM cells, registers and/or latches, and (ii) majority detection circuitry. The output of the robust memory cell may be directly or indirectly provided to mode/function select circuitry (i.e., circuitry to implement a mode or function in the integrated circuit) which, in response, implements a predetermined mode of operation or function in relation to other circuitry of/in the integrated circuit.

Figure 3B:
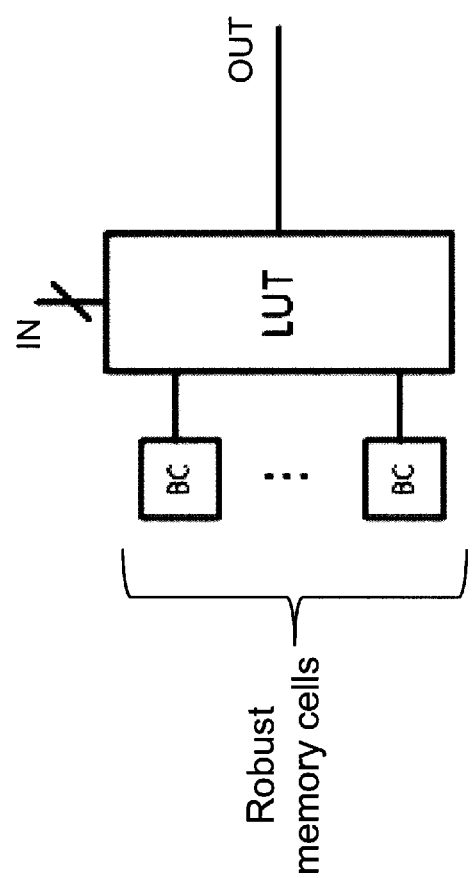
FIG. 3B illustrates an exemplary LUT which is connected to and includes a plurality of robust memory cells, wherein, in one exemplary embodiment, one or more of such robust memory cells are programmed to a condition or in a manner or state according to certain aspects of the present inventions.

For example, in one embodiment, the output of the robust memory cell, programmed to a condition or in the manner according to the present invention, may be employed to control the selection of an input(s) of one or more multiplexers and/or an element of a look-up table (LUT). (See, FIGS. 3A and 3B, respectively). The multiplexer(s) and/or LUT may, in one embodiment, be used in or a portion of an interconnect network (e.g., U.S. Pat. No. 9,906,225 and/or U.S. Provisional Patent Application No. 62/735,988) in the integrated circuit (e.g., an embedded FPGA).

The robust memory cell is programmed to a state or condition or in a manner according to certain aspects of the present inventions in order to provide an output that is representative of a mode of operation of or function to be implemented in the integrated circuit. In one embodiment, programming circuitry generates, applies and/or provides data and control signals to one or more (or all) of the storage elements to write the appropriate data states therein. In response thereto, the storage elements stores the data state.

Notably, in one embodiment, all of the plurality of storage elements are more than one time programmable, for example, in situ (i.e., during operation of the integrated circuit) and/or at or during power-up, start-up, initialization, re-initialization, configuration, re-configuration or the like. In another embodiment, a plurality (but not all) of the storage elements is more than one time programmable. In yet another embodiment, only one of the storage elements of the plurality of storage elements is more than one time programmable In one embodiment, the present invention programs (e.g., actively or affirmatively programming) a majority of the storage elements of each of the robust memory cells to a first data state. In addition thereto, or in lieu thereof, a minority of the storage elements of the robust memory cells may be programmed to (e.g., actively or affirmatively programmed) or may store a second data state. The majority detection circuitry, in operation, detects the data state of or stored in a majority of the storage elements and, in response thereto, outputs or provides the detected majority data state to, for example, other circuitry in the integrated circuit (e.g., mode/function select circuitry (i.e., circuitry to implement a mode or function in the integrated circuit such as, for example, control certain circuitry to define, establish or implement that mode or function of the integrated circuit)).

Figure 4A:
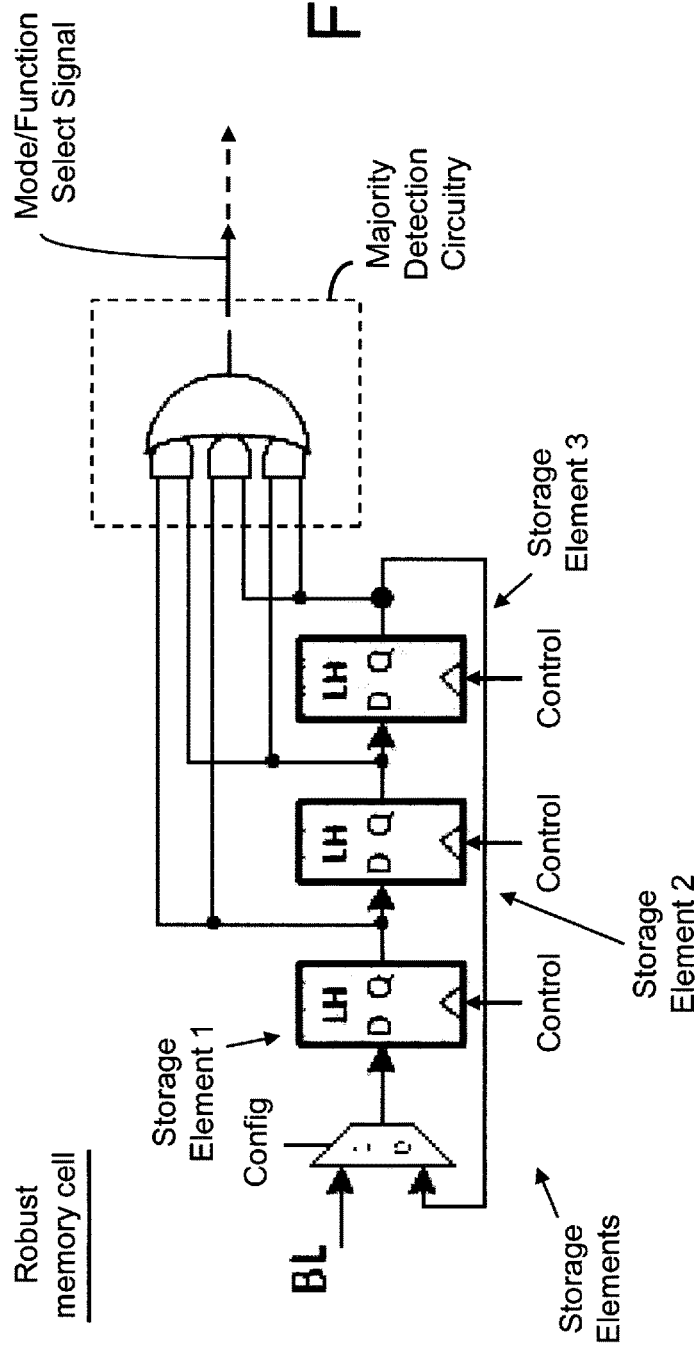
FIGS. 4A-4C illustrate an exemplary circuit diagram of a robust memory cell according to certain aspects of the present inventions, wherein, in this exemplary embodiment, the robust memory cell includes three storage elements (in the exemplary illustrations, latches may be designated or identified "LH") connected to majority detection circuitry in accordance with certain aspects of the present inventions; wherein, in one embodiment, in operation, a majority of the storage elements store or may be programmed with a selected data state, and, in another embodiment, a majority of storage elements (concurrently or consecutively) store or are programmed to a selected data state and a minority of the storage elements (at least one) store or are programmed in another data state (which is different from the selected data state); the majority detection circuitry is configured to detect the data state stored in a majority of the storage elements and output from the robust memory cell a mode or function select signal that is employed by the logic tile to, alone or in combination with other signals, implement a mode of operation or function; notably, an exemplary detailed circuit implementation of the majority detection circuitry is set forth in FIG. 4B and an exemplary detailed circuit implementation of the storage elements of this embodiment are set forth in FIG. 4C.
Figure 4B:
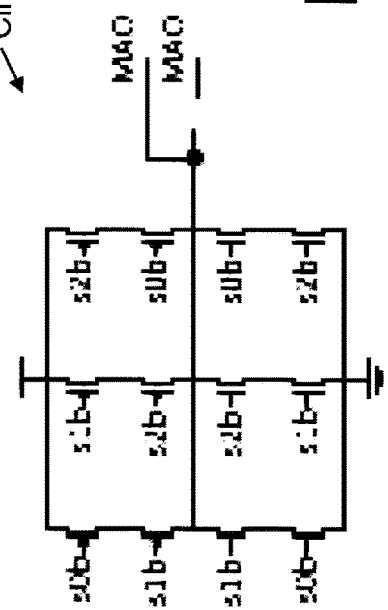

In one embodiment, the robust memory cell includes three storage elements. (See, for example, FIGS. 4A, 4C, 4D and 5-7). The outputs of the storage elements are provided to majority detection circuitry which detects or determines the majority data state stored in the plurality of associated storage elements of the robust memory cell and outputs a data state representative thereof or consistent therewith. An exemplary implementation of the majority detection circuitry is illustrated in FIG. 4B. Notably, any majority detection circuitry, now known or later developed, is intended to fall within the scope of the present invention.

The storage elements of each robust memory cell of the present invention may be programmed to or store a certain state either consecutively or concurrently. For example, in one embodiment, a majority of the storage elements may be programmed to or store a first data state consecutively in order to store a predetermined data state to a majority of the storage elements (e.g., via clocking a data state to a majority of the storage elements). With reference to FIGS. 4A and 4C, in one embodiment, the storage elements are configured such that the output of a first storage element of a memory cell is connected to the input of a second storage element of that cell (and so on). In operation, the robust memory cell (and, more specifically, the storage elements thereof) may be programmed to store a certain configuration by applying a predetermined data state to a first storage element which may then be clocked to or stored into other storage elements of the memory cell via application of a control signal thereby consecutively, sequentially or serially storing the data into designated or predetermined storage elements of the robust memory cell.

After all, or a majority of the storage elements are programmed to the first data state, a minority of the storage elements may then be programmed (if necessary) to the second data state. For example, in one embodiment, one or more of the storage elements previously storing the first data state may be overwritten to store the second data state. However, provided that a majority of the storage elements still store or contain the first data state, the majority detection circuitry will output data which is representative of the first data state. As noted above, programming circuitry may generate, apply and/or provide appropriate data and control signals to one or more (or all) of the storage elements to write the appropriate data states therein and thereby program the storage element. In response to such data and control, the storage elements stores the data state.

Alternatively, a minority of the storage elements are programmed to the second data state, a majority of the storage elements may then be programmed to the first data state. For example, in one embodiment, two or more of the storage elements previously storing the second data state may be overwritten to store the first data state. Again, provided a majority of the storage elements store the first data state, the majority detection circuitry will detect the majority data state stored in the storage elements and output data which is representative of the first data state.

In yet another embodiment, all of the storage elements are programmed to the second data state, thereafter a majority of the storage elements are then programmed to the first data state. Here, two or more (i.e., a majority) of the storage elements previously storing the second data state may be overwritten to store the first data state. Again, provided a majority of the storage elements store the first data state, the majority detection circuitry will detect the majority data state and output data which is representative of the first data state.

Notably, robust memory cell illustrated in FIGS. 4A and 4C are both examples where the control of the storage elements are controlled separately, to allow the storage elements to be written at different times (e.g., sequentially), to predetermined values (e.g., different values), via one or a single data input (BL).

Figure 4D:
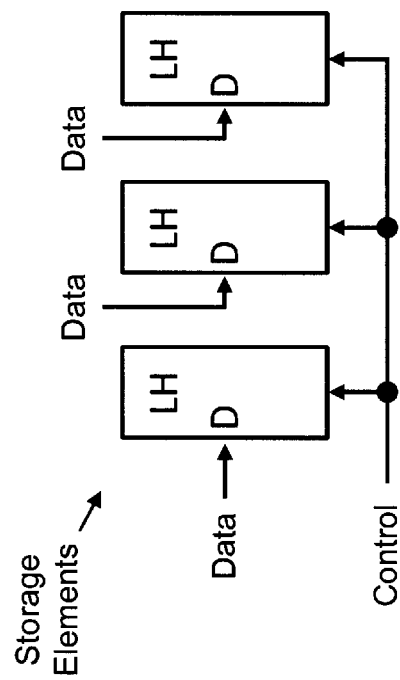
FIG. 4D illustrates an exemplary block diagram of another embodiment of the storage elements (again, in this exemplary block diagram, the storage elements "LH" are latches) of a robust memory cell according to certain aspects of the present inventions, wherein, each storage element separately receives data and the control signals are concurrently applied to the storage elements; notably the outputs of the storage elements and the connections thereof to the majority detection circuitry as well as the configuration of the majority detection circuitry are not illustrated in the block diagram for the purposes of simplification and clarity; however, the connections of the outputs of the storage elements to the majority detection circuitry, as well as the majority detection circuitry, illustrated in FIGS. 4A and 4B, may be employed.
Figure 4C:
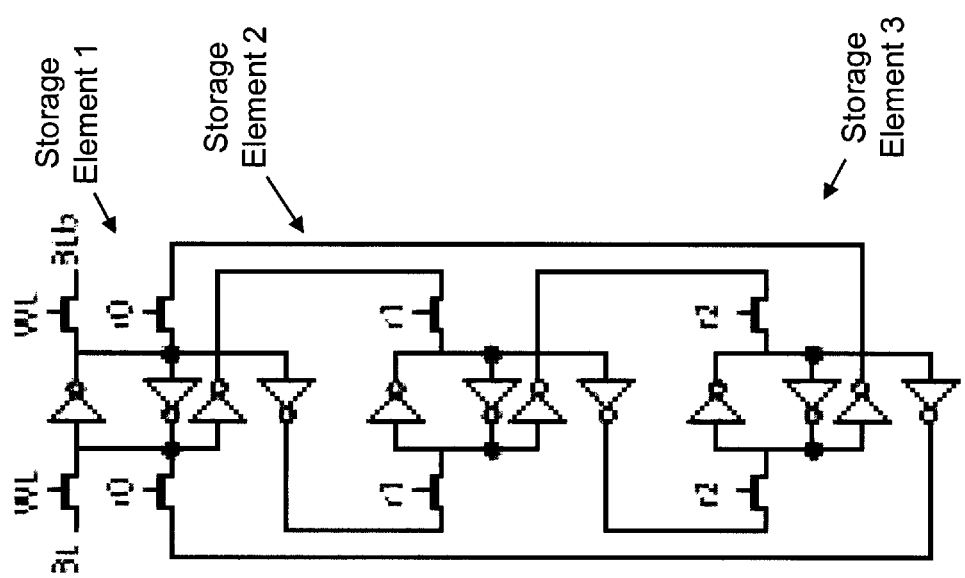
Figure 5:
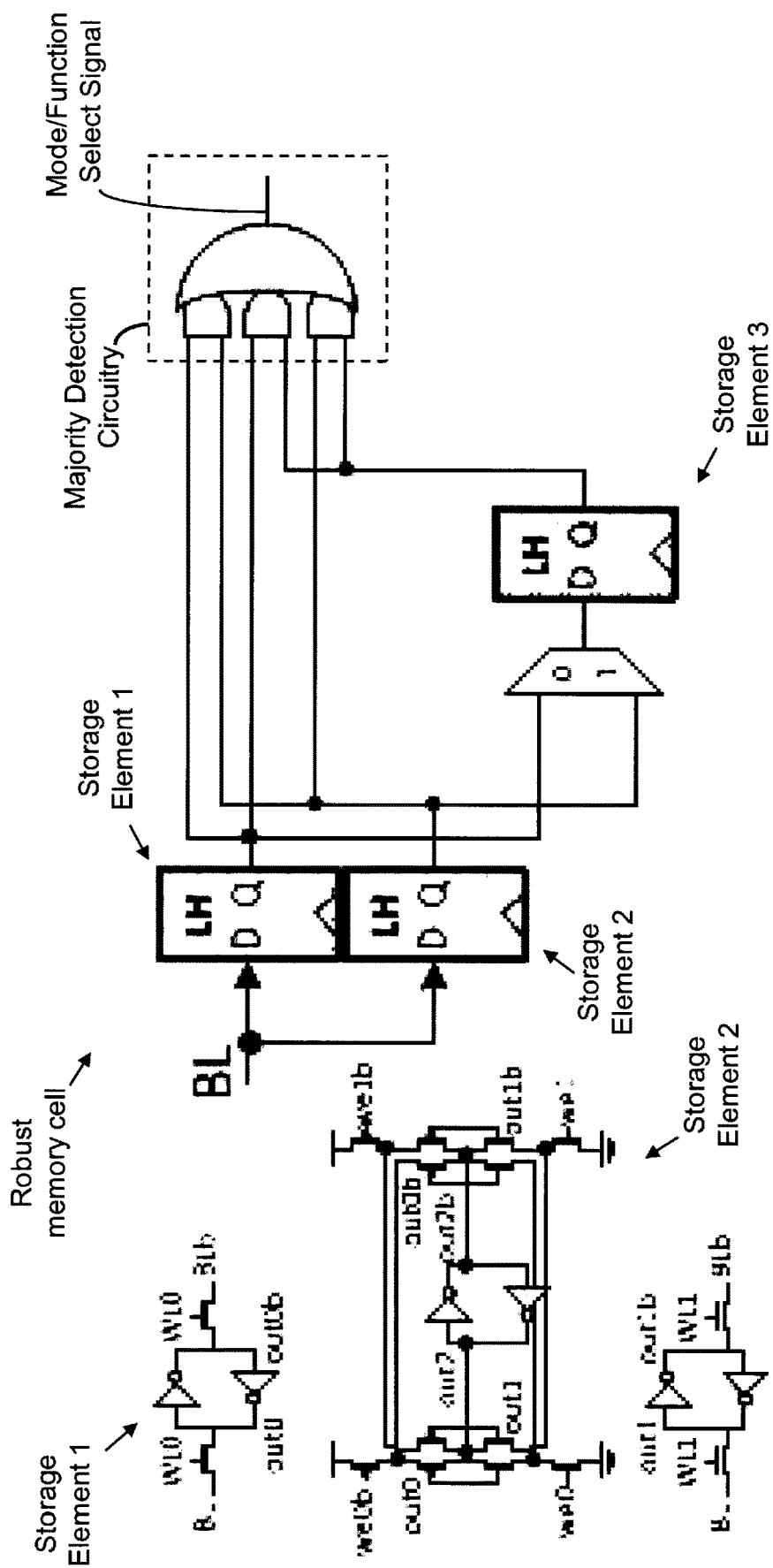
FIGS. 5-7 illustrate exemplary circuit diagrams of other embodiments of a robust memory cell according to certain aspects of the present inventions, wherein, in these exemplary embodiments, the robust memory cell again includes three bit or storage elements (again, in the exemplary illustrations, latches may be designated or identified "LH") connected to majority detection circuitry in accordance with certain aspects of the present inventions; wherein, in operation, a majority of the storage elements store or are programmed with a selected data state (and in one embodiment, a majority of storage elements store or are programmed to a selected data state and a minority of the storage elements (at least one) store or are programmed in another data state (which is different from the selected data state), wherein the majority detection circuitry is configured to detect and output from the robust memory cell a mode or function select signal that is employed by the logic tile to, alone or in combination with other signals, implement a mode of operation or function; notably, an exemplary detailed circuit implementation of the storage elements of this embodiment are set forth to the left of the robust memory cell circuit diagram; the storage elements and the majority detection circuitry may be any logic now known or later developed, for example, AND, NAND, OR, NOR, inverter and/or buffer gates/logic; moreover, while the robust memory cell of the illustrated circuit diagrams includes three storage elements, the robust memory cell may include more than three storage elements and may be implemented with and/or include different types of storage elements (e.g., SRAM, MRAM, Flash, flip/flops (F/Fs))
Figure 6:
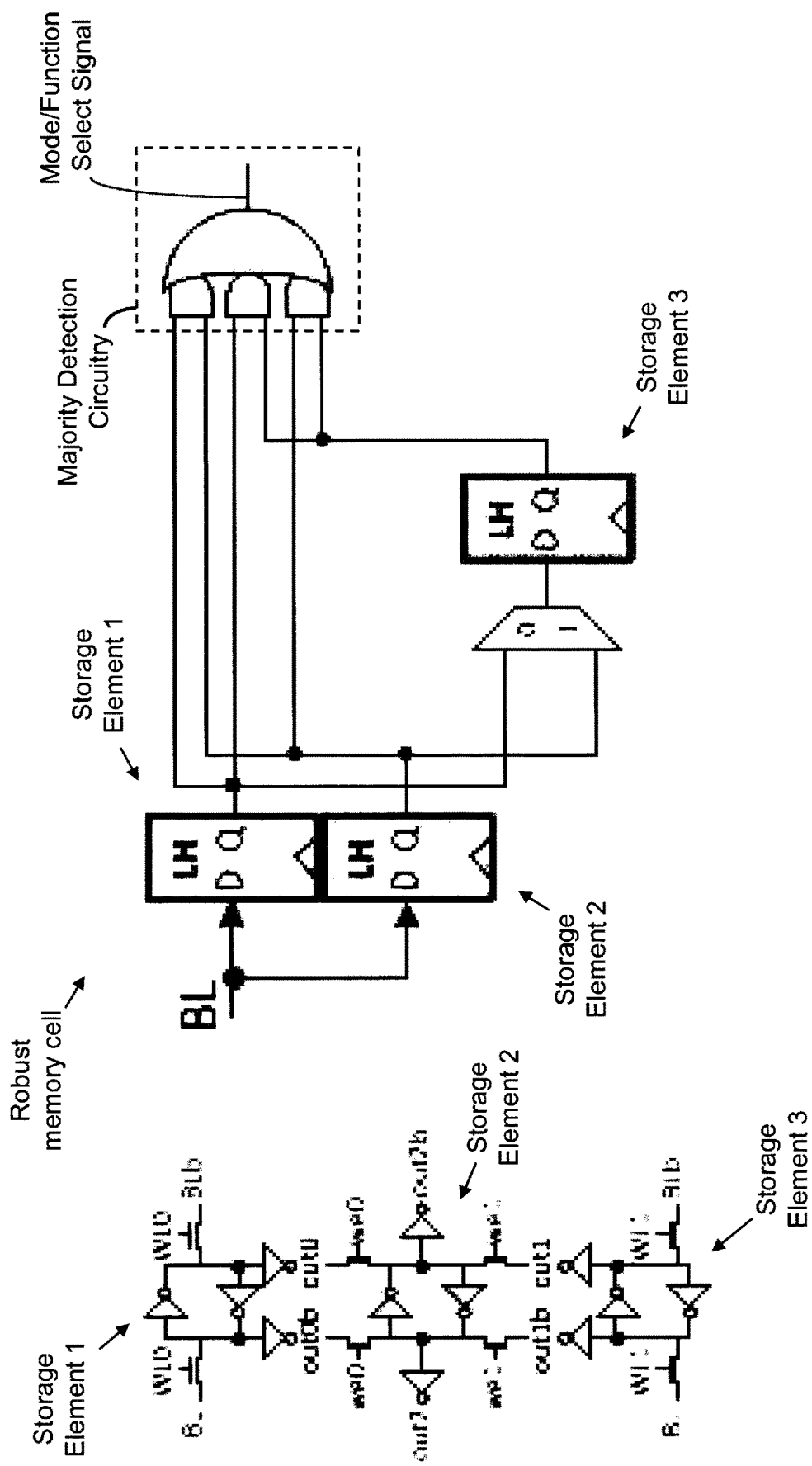
Figure 7:
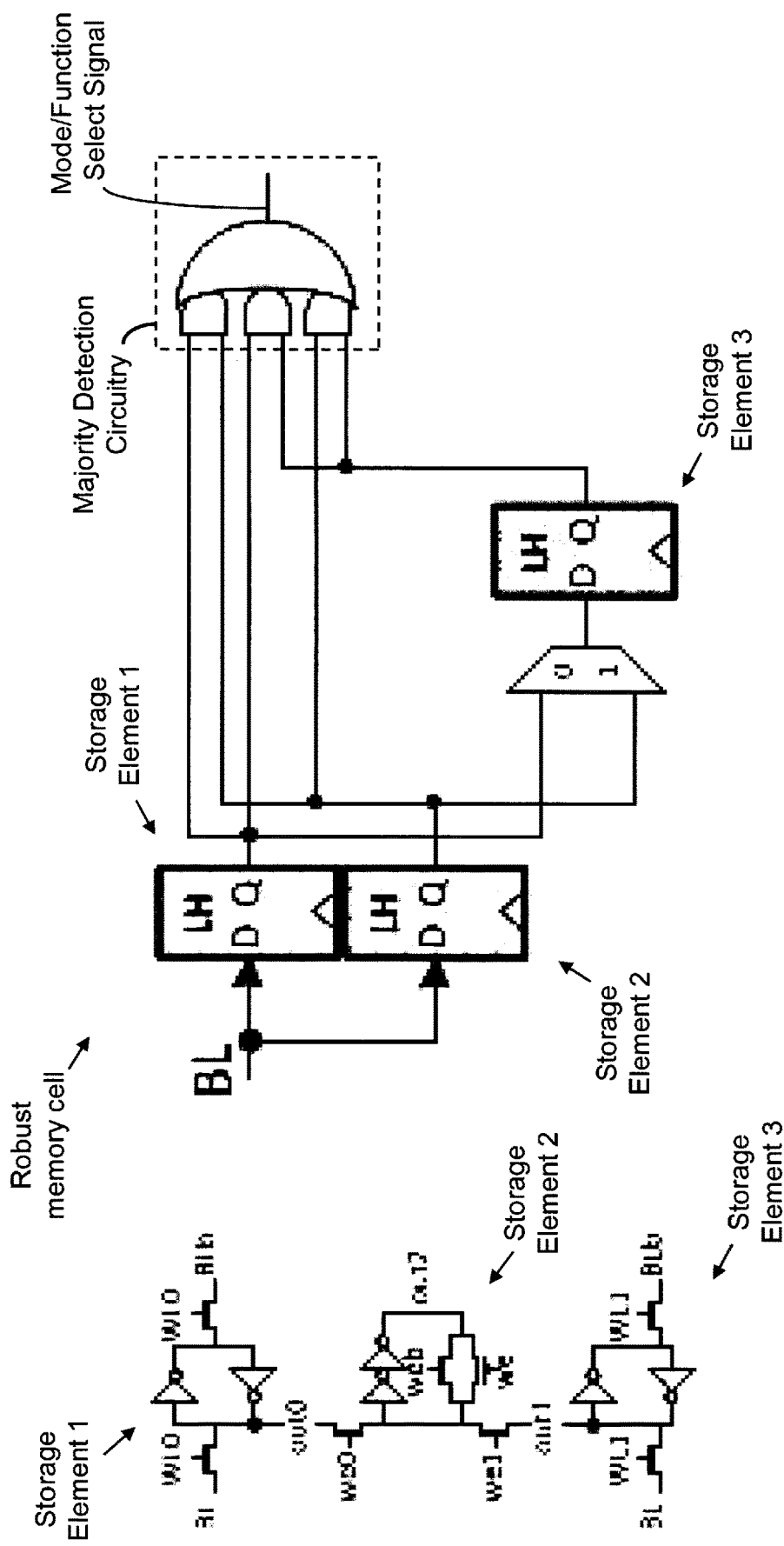

With reference to FIG. 4D, in another embodiment, a predetermined data state may be applied to the respective data input of each storage element and thereafter stored in a plurality of elements in parallel (e.g., via application of a clock or control signal). Different from the robust memory cell illustrated in FIGS. 4A and 4C, FIG. 4D is an example where the control of the storage elements of a robust memory cell are shared, but the data inputs are configured or controlled separately, to thereby allow the different storage elements to be written at the same time, to predetermined values (e.g., different values), using a single or common control input (upon which a clock or control signal is applied concurrently to each of the storage elements). Notably, for the purposes of simplification and clarity, the storage element connection to the majority detection circuitry and configuration of the majority detection circuitry are not illustrated in the block diagram. However, the connection between the storage elements and the majority detection circuitry, illustrated in FIG. 4A, may be employed. Moreover, the majority detection circuitry, illustrated in FIG. 4B, may also be employed in the connection with the storage elements of the robust memory cell illustrated in FIG. 4D.

With reference to FIGS. 4A and 5-7, the output of the majority detection circuitry (alone or in conjunction with the state(s) stored in other robust memory cell(s)) is applied to other circuitry of the integrated circuit which, alone or in combination with other data (e.g., data from other robust memory cell(s)—including cell(s) that are programmed to a condition or in a manner according to the present inventions) sets, defines, determines or configures a mode of operation or function to be performed in or by the integrated circuit (or a portion thereof—for example, a mode of operation of a portion of the circuitry of an integrated circuit). Here, the output of the robust memory cell, for example, as programmed or configured in the manner described herein, is employed or sets, defines, determines or configures a mode of operation or function of the integrated circuit (or a portion thereof).

The robust memory cell may be programmed or configured according to certain aspects of the present inventions whereby, in one embodiment, a majority of the storage elements of the cell are programmed to or store a first/majority data state. In another embodiment, the robust memory cell may be configured whereby a majority (not all) of the storage elements of the cell are programmed to or store a first/majority data state and a minority (at least one) of the storage element(s) is/are programmed to or stores/store a second/minority data state (i.e., a data state that is different from the first/majority data state). The difference between the total number of storage elements storing the majority data state versus the minority data state may be any number. Indeed, in a preferred embodiment, the robust memory cell is configured such that the difference between the number of storage elements storing the first/majority data state and the number of storage elements storing the second/minority data state is equal to one. The data state stored in a majority of the storage elements and the data state stored in a minority of the storage elements may be established, programmed or configured using any technique now known or later developed.

Notably, the mode/function select signal output by the robust memory cell may be changed from one state to another via changing less than a majority of the data states of the storage elements of the robust memory cell. Indeed, in one embodiment, the data state of one of the storage elements (which previously stored a data state corresponding to the majority data state) may be configured to or re-configured to store a data state that previously corresponded to the minority data state—thereby making the previously minority data state the "new" majority data state. Here, the majority detection circuitry would detect the "new" majority data state after storing, changing, configuring or re-configuring a new/different data state in one of the storage elements that previously stored the "old" majority data state and was one of the "old" majority storage elements. Thus, in this embodiment, the mode/function select signal output by the robust memory cell may be changed via changing less than a majority of the data states of the storage elements of the robust memory cell (for example, in a preferred embodiment, the changing the data state stored or programmed in only one of the storage elements).

Specifically, where a majority of the storage elements of the robust memory cell store a first data state and a minority of the storage elements store a second data state, and the minority of storage elements is one less than the majority, the mode/function select signal output by the robust memory cell may be changed by changing the data state of one of the storage elements that stores the first (in this example, the majority) data state. Under these circumstances, the "new" majority (i.e., the data state configured or stored in the majority of storage elements) is the second data state because a majority of the storage elements store or are configured to the second data state—and the robust memory cell outputs the second data state. Here, the majority detection circuitry determines the data state stored or contained in a majority of the storage elements is the second data state and, in response, the second data state—which may be representative of a different mode of operation of the integrated circuit (or a portion thereof) relative to the first data state. Thus, in one embodiment, the robust memory cell is configured to provide a difference between the number of storage elements storing the first data state and the number of storage elements storing the second data state of one. In that way, the mode/function select signal may be changed between states via changing the data state stored in only one of the storage elements of the majority.

In one embodiment, where the difference between the number of storage elements storing the majority data state and the number of storage elements storing the minority data state is equal to one, it may be advantageous to configure the robust memory cell such that by controlling the data state stored in a storage element that is most rapidly programmed or readily available to be programmed (in relation to the other storage elements of the memory cell), the output of the robust memory cell is changed or controlled. For example, with reference to FIG. 4A, it may be advantageous to store a majority bit in storage element 1 because storage element 1 is more rapidly programmed or readily accessible to program than storage element 2 and storage element 3 given the sequential programming of the storage elements of the robust memory cell illustrated in FIG. 4A. That is, by programming or re-programming storage element 1 to store the previous minority data state, thereby changing the previous minority data state to be the "new" majority data state, the robust memory cell is most rapidly and/or readily/easily re-programmed to the "new" majority data state. In addition, the value of storage element 1 is also written into storage element 2 (storage element 3 retains the "old" majority bit value). Afterwards, to change the mode/function back to the "old" majority bit is more readily/easily achieved by writing the value from storage element 3 back into storage element 1. As such, in this way, the robust memory cell may be advantageously configured or programmed to implement a change or toggle of the output of the robust memory cell between the different states (i.e., from original state to new state as well as from new state to original/old state) via programming, configuring or changing the data state stored in only one of the storage elements of the robust memory cell. In sum, programming the robust memory cell in that way, the robust memory may be more rapidly programmed (or toggled) between outputting the different data states which, alone or in conjunction with the data state(s) output/ stored in other robust memory cell(s), is employed or defines, determines or configures a mode of operation or function of the integrated circuit.

Notably, the storage elements of the robust memory cell may not be affirmatively or actively programmed to a given data state (e.g., in those situations where the storage elements have a default data state). For example, where a default data state of storage element, at start-up, reset or configuration/re-configuration, is to be the majority data state, no affirmative or active programming is required after, for example, start-up, reset or configuration/re-configuration (provided the default state is the desired majority data state). Where, however, the present inventions program or store a majority of storage elements of the robust memory cell(s) to a first data state (the default state) and a minority of the storage elements (at least one) to a second data state (which is different from the first data state), only a minority of the storage elements are programmed to a data state that is different from the data state stored in a majority of the storage elements of the robust memory cell. As such, in these embodiment, only one of the data states are stored or programmed into a majority or a minority of the storage elements (whereas the other or different data state is the default state—which may be stored or programmed, for example, start-up, reset or configuration/re-configuration.

As noted above, in one embodiment, mode/function select circuitry, in response to the mode/function select signal(s), implements a predetermined mode of operation or function in relation to other circuitry of the integrated circuit (e.g., the mode/function select signal enables certain circuitry, implements a particular interconnect architecture via changing the control input(s) applied to multiplexers of the interconnect architecture.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Further, although the memory cells in certain embodiments are illustrated as static memory cells or storage elements, the present inventions may employ dynamic or static memory cells or storage elements. Indeed, as stated above, such memory cells or storage elements may be latches, flip/flops or any other static memory cell or memory cell circuit now known or later developed. Indeed, one or more of the storage elements may be a first (e.g., flip-flop or latch) and one or more other storage elements of the robust memory cell may be a second (e.g., an SRAM cell).

The present inventions may be implemented in commercial grade integrated circuits and/or non-commercial grade integrated circuits (i.e., integrated circuits designed for military and/or aerospace applications). For example, in one embodiment, one or more of the robust memory cell of the present inventions is/are implemented in integrated circuits that are designed for commercial use and programmed to a condition or state according to the present inventions, to store, set, configure or define a mode of operation or function of the integrated circuit. Commercial grade integrated circuits typically do not include any form or of robust memory cell.

Notably, any or configuration of majority detection circuitry, whether now known or later developed, may be employed to implement the inventions described and/or illustrated herein. In addition, as intimated above, any or configuration of the storage elements, now known or later developed, may also be employed to implement the inventions.

Figure 8A:
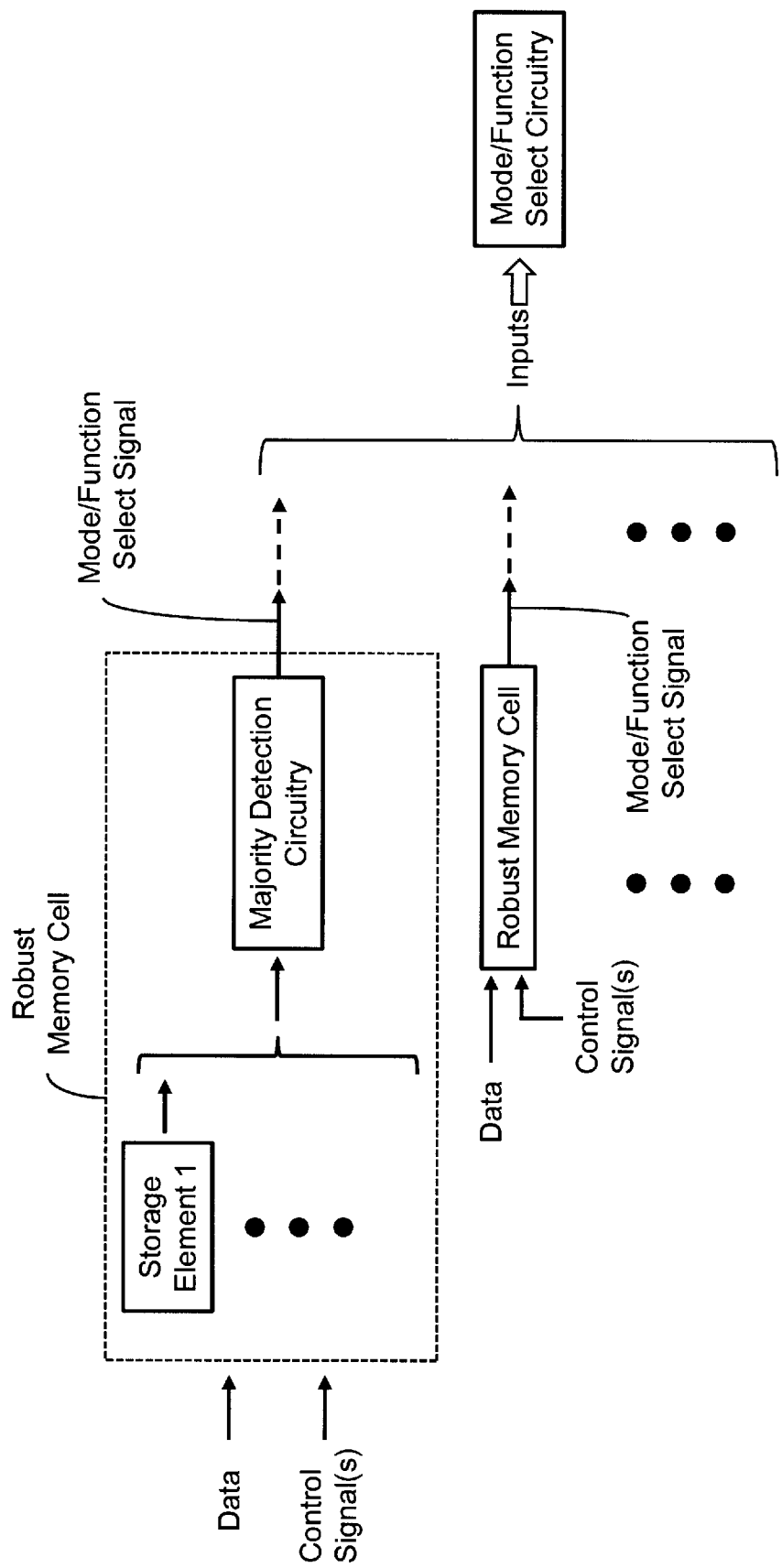
FIG. 8A illustrates an exemplary block diagram of a plurality of robust memory cells, programmed to a condition or in a manner or state according to certain aspects of the present inventions, coupled to mode/function select circuitry, which responsively implements (e.g., in situ and/or at or during power-up, start-up, initialization, re-initialization, configuration, re-configuration or the like) one or more modes of operation or functions of an integrated circuit, for example, one or more (or all) logic tiles (or portions of such logic tile(s)) of the FPGA.
Figure 8B:
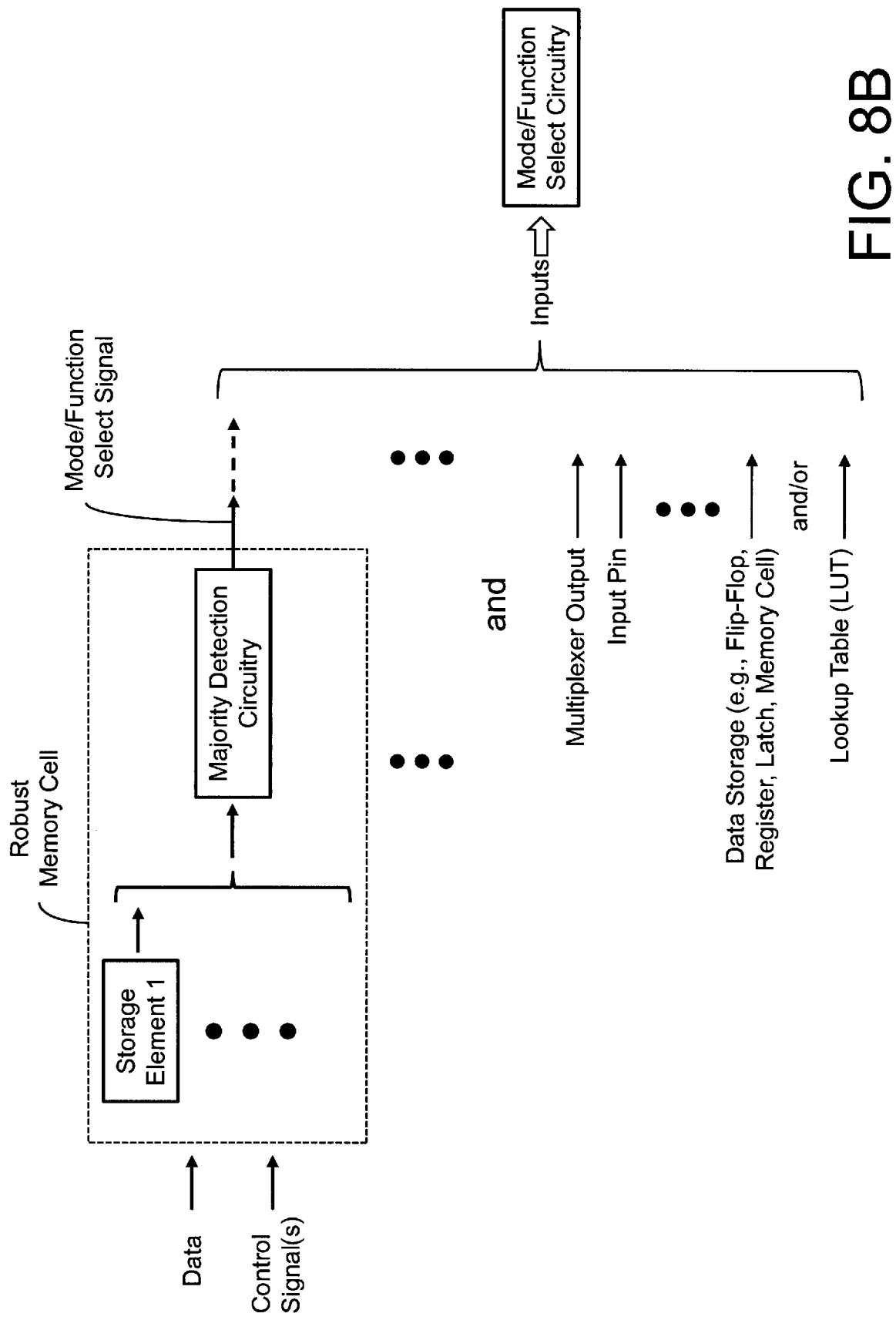
FIG. 8B illustrates an exemplary block diagram of one or more robust memory cells, programmed to a condition or in a manner or state according to certain aspects of the present inventions, and other input(s)/signal(s) from, for example, a robust memory cell or data storage element (e.g., a typical memory cell, register, flip-flop, latch, block/array of memory), an input pin, a look-up table LUT (of any kind or), and/or an output of a multiplexer, coupled to mode/function select circuitry, which responsively implements (e.g., in situ and/or at or during power-up, start-up, initialization, re-initialization, configuration, re-configuration or the like) one or more modes of operation or functions of an integrated circuit, for example, one or more (or all) logic tiles (or portions of such logic tile(s)) of the FPGA.

Further, as intimated above, the mode/function select circuitry may employ data from more than one robust memory cell (programmed or configured in accordance with the present inventions) to determine a mode of operation or function of an integrated circuit, for example, one or more (or all) logic tiles (or portions of such logic tile(s)) of an FPGA. With reference to FIG. 8A, the mode/function select circuitry receives mode/function select signals from a plurality of robust memory cells, programmed to a condition or in a manner or state according to certain aspects of the present inventions. In addition thereto, or in lieu thereof, the mode/function select circuitry may receive mode/function select signals from one or more robust memory cells, programmed to a condition or in a manner or state according to certain aspects of the present inventions, and one or more other inputs/signals from, for example, a robust memory cell or data storage element (e.g., a typical memory cell, register, flip-flop, latch, block/array of memory), an input pin, a look-up table LUT (of any kind or), and/or an output of a multiplexer. (See, FIG. 8B). The mode/function select circuitry, in response thereto, may employ such signal(s) to implement (e.g., in situ and/or at or during power-up, start-up, initialization, re-initialization, configuration, re-configuration or the like) one or more modes of operation or functions of an integrated circuit.

Notably, mode/function select circuitry may be any circuitry now known or later developed that employs mode/function select signals from one or more robust memory cells to implement one or more modes of operation or functions of an integrated circuit. For example, mode/function select circuitry may include AND, NAND, OR, NOR, inverter and/or buffer gates/logic, controller circuitry and/or processor circuitry which, in operation, employs signal(s) from one or more robust memory cells, programmed to a condition or in a manner or state according to certain aspects of the present inventions, to implement one or more modes of operation or functions of an integrated circuit.

The term "circuitry" means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The techniques described herein may be implemented using control circuitry (e.g., one or more processors (suitably programmed)) to perform, execute and/or assess one or more of the functions or operations described herein to program the data storage elements and thereby configure the robust memory cell according to the present inventions. Here, the control circuitry (which may be disposed on the integrated circuit) is employed to program the robust memory cell during initialization or at start-up, and/or in situ such that the output of the robust memory cell is employed to establish or implement a mode of operation or function in, for example, the logic tile.

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

In the claims, and elsewhere, the terms "comprises," "comprising," "includes," "including," "have," and "having" or any other variation thereof, are intended to cover a non-exclusive inclusion, such that a process, method, circuit, article, integrated circuit or apparatus that includes/comprises a list of elements, components, steps (etc.) does not include only those elements, components, steps (etc.) but may include other elements, components, steps (etc.) not expressly listed or inherent to such process, method, circuit, article, integrated circuit or apparatus. Further, in the claims, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

In the claims, and elsewhere, the terms "a" and "an" herein do not denote a limitation of quantity, but rather denote the presence of at least one of the referenced item. In addition, the terms "first," "second," and the like, herein do not denote any order, quantity, or importance, but rather are used to distinguish one element from another. Further, in the claims, and elsewhere, the term "integrated circuit" means, among other things, a processor, controller, state machine, gate array, SoC, PGA and/or FPGA. The term "integrated circuit" also means, for example, a processor, controller, state machine and SoC—including an embedded FPGA. For the avoidance of doubt, field programmable gate array or FPGA means both an FPGA and an embedded FPGA.

Further, in the claims, the term "logic tile" means a design unit or block of a plurality of transistors (typically more than thousands), which, in this application, is capable of connecting to one or more neighboring logic tiles, logic cells, logic cores or logic blocks. Moreover, the term "multiplexers", in the claims, means multiplexers and/or switches. In addition, the term "initialization operation", in the claims, means the power-up, start-up, initialization, re-initialization, configuration, and/or re-configuration operation of the robust memory cells (or the storage elements thereof) and/or the integrated circuit.

In the claims, the term or phrase "mode of operation" means mode of operation of or function of the integrated circuit (or a portion thereof—for example, a mode of operation of or function of the circuitry of an integrated circuit (e.g., an FPGA) or a portion of the circuitry of the integrated circuit).

What is claimed is:

1. An integrated circuit comprising:
   field programmable gate array including:
   a plurality of logic tiles, wherein each logic tile includes circuitry including (i) logic circuitry and (ii) an interconnect network including a plurality of multiplexers;
   a first robust memory cell including:
      three or more latches, wherein each latch of the first robust memory cell is more than one time programmable to store a data state,
      majority detection circuitry, coupled to the three or more latches of the first robust memory cell, to detect a majority data state stored in the three or more latches of the first robust memory cell and output first data of the detected majority data state stored in the three or more latches of the first robust memory cell, and
   a second robust memory cell including:
      three or more latches, wherein each latch of the second robust memory cell is more than one time programmable to store a data state,
      majority detection circuitry, coupled to the three or more latches of the second robust memory cell, to detect a majority data state stored in the latches of the second robust memory cell and output second data of the detected majority data state stored in the three or more latches of the second robust memory cell; and
   mode/function select circuitry, coupled to the majority detection circuitry of the first robust memory cell and the majority detection circuitry of the second robust memory cell, to receive the first data of the detected majority data state stored in the three or more latches of the first robust memory cell and second data of the detected majority data state stored in the three or more latches of the second robust memory cell and, in response, configure a mode of operation of at least a portion of the circuitry in one or more of the plurality of logic tiles based on the first data or the second data.

2. The integrated circuit of claim 1 wherein the at least a portion of the circuitry is the interconnect network.

3. The integrated circuit of claim 1 wherein the at least a portion of the circuitry is the logic circuitry.

4. The integrated circuit of claim 1 wherein the three or more latches of the first robust memory cell is equal to M+N latches, wherein M and N are positive integers, and wherein:
   M latches store a first data state,
   N latch(es) store a second data state, and
   M−N is equal to one.

5. The integrated circuit of claim 1 further including:
   programming circuitry, coupled to the first robust memory cells, to generate control and data signals to write one or more data states into the latches of the first robust memory cell; and
   wherein the three or more latches of the first robust memory cell is equal to M+N latches, wherein M and N are positive integers, and wherein:
   the programming circuitry, in operation, writes:
      a first data state into M latches of the first robust memory cell, and
      a second data state into N latch(es) of the first robust memory cell, wherein M−N is equal to one.

6. The integrated circuit of claim 1 wherein the three or more latches of the first robust memory cell is equal to M+N latches, wherein M and N are positive integers, and wherein:
   M latches of the first robust memory cell store a first data state,
   N latch(es) of the first robust memory cell store a second data state, and
   M−N is greater than one.

7. The integrated circuit of claim 1 further including:
   programming circuitry, coupled to the first robust memory cells, to generate control and data signals to write one or more data states into the latches of the first robust memory cell; and
   wherein the three or more storage elements is equal to M+N latches of the first robust memory cell, wherein M and N are positive integers, and wherein:
   the programming circuitry, in operation, writes:
      a first data state into M latches of the first robust memory cell, and
      a second data state into N latch(es) of the first robust memory cell, wherein M−N is greater than one.

8. A method of configuring a mode of operation of an integrated circuit including a field programmable gate array having (A) a plurality of logic tiles, wherein each logic tile includes circuitry including (i) logic circuitry and (ii) an interconnect network including a plurality of multiplexers, (B) mode/function select circuitry, and (C) a robust memory cell including (i) three or more storage elements, wherein each storage element separately stores a data state and is more than one time programmable to store the data state, and (ii) majority detection circuitry, coupled to the three or more storage elements, to detect a majority data state stored in the storage elements, and wherein the three or more storage elements is equal to M+N storage elements, wherein M and N are positive integers and M is greater than N, and wherein M storage elements of the robust memory cell store a first data state and N storage elements store a second data state, the method comprising:
   storing a data state into each of the storage elements of the robust memory cell;
   detecting first majority data state stored in the storage elements based on the data states stored in the storage elements of the robust memory cell to generate first mode select data wherein the first mode select data is representative of the first majority data state stored in the plurality of storage elements;
   outputting first mode select data to the mode/function select circuitry to determine a first mode of operation based on the first mode select data; and
   configuring of at least a portion of the circuitry in one or more of the plurality of logic tiles according to the first mode of operation;
   changing the mode of operation of at least a portion of the circuitry in one or more of the plurality of logic tiles by:
      writing the second data state to at least one of the M storage elements of the robust memory cell,
      storing the second data state into the one of the M storage elements,
      detecting a second majority data state stored in the storage elements of the robust memory cell to determine a second mode select data which is representative of the second majority data state stored in the plurality of storage elements, wherein the second majority data state is the second data state,
      outputting second mode select data to the mode/function select circuitry to determine a second mode of operation based on the second mode select data, and
      configuring of at least a portion of the circuitry in one or more of the plurality of logic tiles according to the second mode of operation; and
   after changing the mode of operation of at least a portion of the circuitry in one or more of the plurality of logic tiles to a second mode of operation, changing the mode of operation of at least a portion of the circuitry in one or more of the plurality of logic tiles to a third mode of operation by:
      writing the first data state to at least one of the N storage elements of the robust memory cell;
      storing the first data state into the at least one of the N storage elements, wherein the number of storage elements storing the first data stage is greater than the number of storage elements storing the second data state;
      after storing the first data state into the one of the N storage elements, detecting a change in the majority data state stored in the storage elements of the robust memory cell to determine a change in the mode select data which is representative of the change in majority data state stored in the plurality of storage elements;
      outputting the change in mode select data to the mode/function select circuitry to determine a change in the mode of operation based on the change in mode select data; and
      configuring of at least a portion of the circuitry in one or more of the plurality of logic tiles according to the change in mode of operation.

9. The method of claim 8 wherein the three or more storage elements is equal to M+N storage elements, wherein M and N are positive integers, and the absolute value of M−N is equal to one, the method further including:

writing a first data state to M storage element(s) of the robust memory cell;
storing the first data state into the M storage element(s);
writing a second data state to N storage element(s) of the robust memory cell; and
storing the second data state into the N storage element(s); and
wherein the first majority data state is the first data state.

10. The method of claim 9 further including:
changing the mode of operation of at least a portion of the circuitry in one or more of the plurality of logic tiles by:
writing the second data state to only one of the M storage elements of the robust memory cell;
storing the second data state into the one of the M storage elements;
detecting a second majority data state stored in the storage elements of the robust memory cell to determine a second mode select data which is representative of the second majority data state stored in the plurality of storage elements, wherein the second majority data state is the second data state;
outputting second mode select data to the mode/function select circuitry to determine a second mode of operation based on the second mode select data; and
configuring of at least a portion of the circuitry in one or more of the plurality of logic tiles according to the second mode of operation.

11. The method of claim 8 wherein the three or more storage elements is equal to M+N storage elements, wherein M and N are positive integers, the method further including:
writing a first data state to the M+N storage elements of the robust memory cell; and
thereafter writing a second data state to N storage element(s) of the robust memory cell.

12. The method of claim 8 wherein the three or more storage elements is equal to M+N storage elements, wherein M and N are positive integers, and the absolute value of M−N is greater than one, the method further including:
writing a first data state to M storage element(s) of the robust memory cell;
storing the first data state into the M storage element(s);
writing a second data state to N storage element(s) of the robust memory cell; and
storing the second data state into the N storage element(s); and
wherein the first majority data state is the first data state.

13. An integrated circuit comprising:
field programmable gate array including:
a plurality of logic tiles, wherein each logic tile includes circuitry including (i) logic circuitry and (ii) an interconnect network including a plurality of multiplexers;
a first robust memory cell including:
three or more storage elements, wherein each storage element is more than one time programmable to store a data state,
majority detection circuitry, coupled to the three or more storage elements, to detect a majority data state stored in the storage elements of the first robust memory cell and output data of the detected majority data state, and
an output, coupled to the majority detection circuitry of the first robust memory cell, to output mode select data of the first robust memory cell which is the majority data state detected by the majority detection circuitry and stored in the storage elements of the first robust memory cell; and
a second robust memory cell including:
three or more storage elements, wherein each storage element of the second robust memory cell is more than one time programmable to store a data state,
majority detection circuitry, coupled to the three or more storage elements of the second robust memory cell, to detect a majority data state stored in the storage elements of the second robust memory cell and output data of the detected majority data state, and
an output, coupled to the majority detection circuitry of the second robust memory cell, to output mode select data of the second robust memory cell which is the majority data state detected by the majority detection circuitry and stored in the storage elements of the second robust memory cell; and
mode/function select circuitry, coupled to the output of the first robust memory cell and the output of the second robust memory cell, to configure a mode of operation of at least a portion of the circuitry in one or more of the plurality of logic tiles based on the mode select data output from the first robust memory cell and the mode select data output from the second robust memory cell.

14. The integrated circuit of claim 13 wherein the at least a portion of the circuitry is the interconnect network or the logic circuitry.

15. The integrated circuit of claim 13 wherein:
wherein the three or more storage elements of the first robust memory cell is equal to M+N storage elements, wherein M and N are positive integers, and the absolute value of M−N is equal to one, wherein:
M storage element(s) of the first robust memory cell store either a first or second data state,
N storage element(s) of the first robust memory cell store a data state that is different from the data state stored in the M storage element(s) of the first robust memory cell, and
wherein the three or more storage elements of the second robust memory cell is equal to M+N storage elements, wherein:
M storage element(s) of the second robust memory cell store either the first or second data state, and
N storage element(s) of the second robust memory cell store a data state that is different from the data state stored in the M storage element(s) of the second robust memory cell.

16. The integrated circuit of claim 13 further including:
programming circuitry, coupled to the first and second robust memory cells, to generate control and data signals to write one or more data states into the storage elements of the first and second robust memory cells wherein, in operation, the programming circuitry writes:
either the first or second data state into M storage element(s) of each of the first and second robust memory cells, and
a data state into the N storage element(s) that is different from the data state stored in the M storage element(s) of each of the first and second robust memory cells.

17. The integrated circuit of claim 13 wherein:
wherein the three or more storage elements of the first robust memory cell is equal to M+N storage elements, wherein M and N are positive integers, and the absolute value of M−N is greater than one, wherein:

M storage element(s) of the first robust memory cell store either a first or second data state, N storage element(s) of the first robust memory cell store a data state that is different from the data state stored in the M storage element(s) of the first robust memory cell, and wherein the three or more storage elements of the second robust memory cell is equal to M+N storage elements, wherein:

M storage element(s) of the second robust memory cell store either the first or second data state, and N storage element(s) of the second robust memory cell store a data state that is different from the data state stored in the M storage element(s) of the second robust memory cell.

* * * * *